(12) United States Patent
Dang et al.

(10) Patent No.: US 8,912,045 B2
(45) Date of Patent: Dec. 16, 2014

(54) THREE DIMENSIONAL FLIP CHIP SYSTEM AND METHOD

(75) Inventors: Bing Dang, Chappaqua, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 13/494,667

(22) Filed: Jun. 12, 2012

(65) Prior Publication Data
US 2013/0330880 A1    Dec. 12, 2013

(51) Int. Cl.
*H01L 21/00* (2006.01)

(52) U.S. Cl.
USPC ............ 438/110; 438/612; 438/112; 438/113

(58) Field of Classification Search
CPC ................................. H01L 23/49; H01L 24/14
USPC .......................................... 438/110, 113, 612
See application file for complete search history.

(56) References Cited

U.S. PATENT DOCUMENTS

| | | | |
|---|---|---|---|
| 5,244,143 A * | 9/1993 | Ference et al. | 228/180.21 |
| 6,730,989 B1 | 5/2004 | Reithinger | |
| 7,198,969 B1 * | 4/2007 | Khandros et al. | 438/33 |
| 7,241,678 B2 | 7/2007 | Ho | |
| 7,257,887 B2 | 8/2007 | Lee | |
| 7,399,695 B2 | 7/2008 | Ho | |
| 7,413,925 B2 * | 8/2008 | Egawa | 438/106 |
| 2001/0008042 A1 | 7/2001 | Davis | |
| 2002/0185303 A1 | 12/2002 | Takeuchi | |
| 2004/0146383 A1 | 7/2004 | Behnke | |
| 2005/0142835 A1 | 6/2005 | Ball | |
| 2008/0035274 A1 * | 2/2008 | Kanisawa | 156/583.1 |
| 2008/0136431 A1 * | 6/2008 | Li et al. | 324/754 |
| 2009/0288767 A1 * | 11/2009 | Sakai et al. | 156/295 |
| 2009/0302095 A1 | 12/2009 | Budd | |
| 2011/0201194 A1 | 8/2011 | Gruber | |
| 2012/0270358 A1 * | 10/2012 | Haviv et al. | 438/68 |
| 2013/0327811 A1 | 12/2013 | Bing Dang | |

FOREIGN PATENT DOCUMENTS

| | | |
|---|---|---|
| JP | 9036530 | 2/1997 |
| JP | 20066294897 | 10/2006 |

OTHER PUBLICATIONS

Definition of "opposing" downloaded from thefreedictionary.com on Jul. 11, 2013.

* cited by examiner

*Primary Examiner* — Charles Garber
*Assistant Examiner* — Brigitte Paterson
(74) *Attorney, Agent, or Firm* — Louis J. Percello; Otterstedt, Ellenbogen & Kammer, LLP

(57) ABSTRACT

Solder is simultaneously transferred from a mold to a plurality of 3D assembled modules to provide solder bumps on the modules. The mold includes cavities containing injected molten solder or preformed solder balls. A fixture including resilient pressure pads and vacuum lines extending through the pads applies pressure to the modules when they are positioned on the mold. Following reflow and solder transfer to the modules, the fixture is displaced with respect to the mold. The modules, being attached to the fixture by vacuum pressure through the pads, are displaced from the mold with the fixture.

1 Claim, 9 Drawing Sheets

ASSEMBLE CHIPS ON INTERPOSER

DICING INTERPOSER

DETACH FROM GLASS HANDLER

ELECTRICAL TEST AND SELECT GOOD MODULES

⬇ PRESSURE

⬆ RELEASE    SOLDER REFLOW ⬇

CLEANING FLUX RESIDUE

FIG. 4A
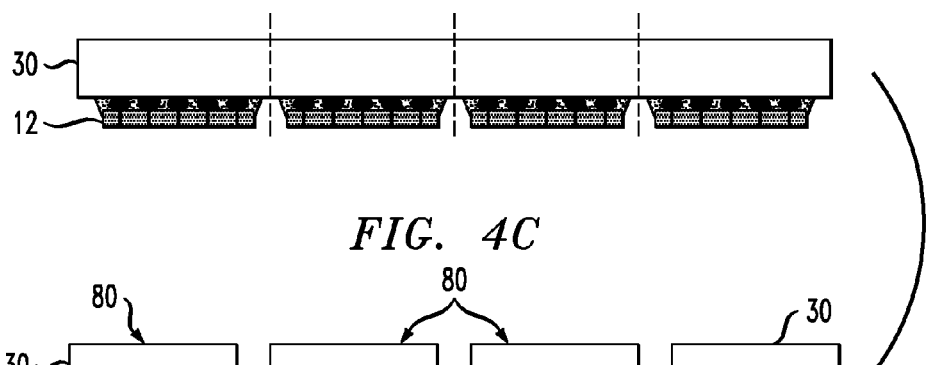
FIG. 4B
FIG. 4C
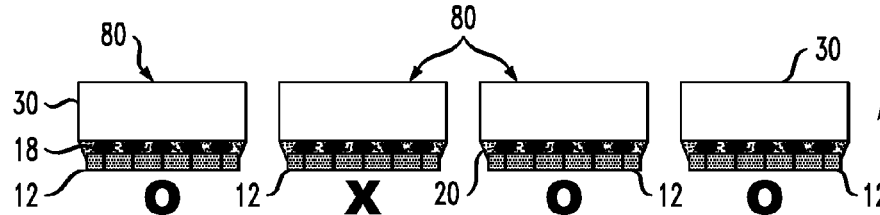
FIG. 4D
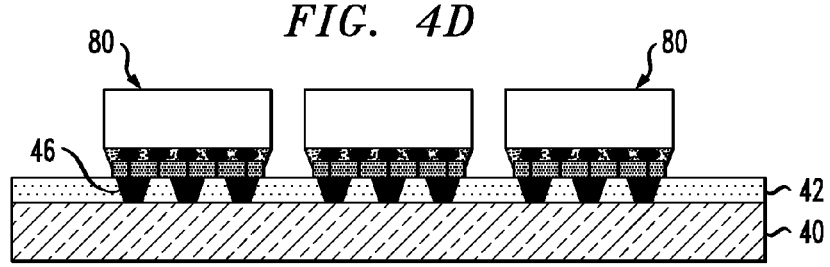
⇩ PRESSURE
FIG. 4E
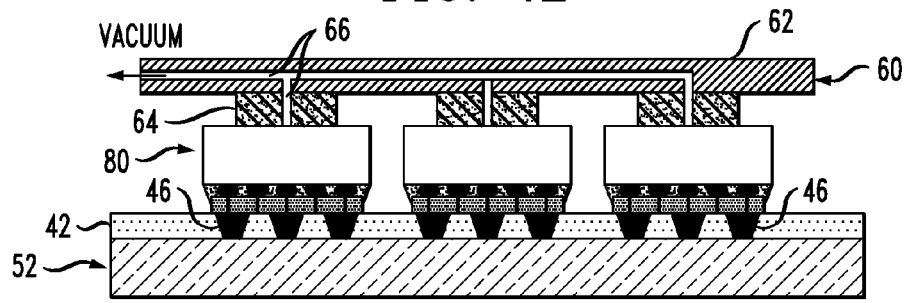

THREE DIMENSIONAL FLIP CHIP SYSTEM AND METHOD

FIELD

The present disclosure generally relates to the electrical and electronic arts and, more particularly, to solder deposition on electronic modules.

BACKGROUND

Three dimensional (3D) IC integration and packaging technologies enable shorter inter-chip interconnection, smaller form factor, higher packaging density, lower power consumption, and higher performance for semiconductor products. Solder bump interconnects are critical to high density chip to chip interconnection in conventional flip chip as well as 3D IC integration. Solder bump are normally deposited on contact pads on chip surfaces at the wafer level as the final wafer processing step, namely wafer bumping. After wafer bumping followed by wafer dicing, the chips (e.g. integrated circuit (IC) chips) are then flipped and positioned such that the solder bumps are aligned with matching pads of an external circuit of substrates, wafers, interposers, or another chips. Solder reflow completes the interconnection process, after which underfill material is introduced to fill the spaces between the interconnects to complete flip chip assembly.

The wafer bumping and chip assembly become more complex for 3D ICs because 3D ICs involve much thinner wafers than conventional wafers, and 3D wafers have devices and circuitry at the both sides of a wafer. The bumping and handling of thin wafers present significant challenges to manufacturing. Conventional wafer bumping requires photolithography and electroplating, which are difficult to apply when a wafer is thin due to warpage and handling. In addition, after a wafer completes the bumping process, the thermal budget of the solder bumps restricts any further wafer level processing. Therefore, it is desirable to apply bottom solder bump after the stacking of 3D ICs, which simplifies the thin wafer handling, processing, and assembly.

SUMMARY

Principles of the present invention provide techniques and a system for effecting solder transfer to assembled 3D modules in a manner that facilitates high throughput.

In accordance with a first aspect, a method is provided that includes providing a mold including a plurality of cavities, providing solder within the cavities, aligning a plurality of discrete electronic modules on the mold such that the electronic modules contact the mold and overlay the cavities, simultaneously exerting pressure on each of the electronic modules in the direction of the mold, reflowing the solder within the cavities while pressure is exerted on the electronic modules, causing the solder to be transferred to the electronic modules from the cavities and form solder bumps thereon, and separating the plurality of electronic modules from the mold.

A further aspect of the present disclosure provides a method including the steps of providing an interposer wafer supported by a handler, stacking a plurality of chips on a top surface of the interposer wafer, attaching the chips to the top surface of the interposer wafer, and dicing the interposer wafer between the chips. The chips are detached from the handler, thereby forming a plurality of discrete electronic modules, each electronic module comprising one or more of the chips and a portion of the interposer wafer attached to the one or more chips. The method further includes providing a mold including a plurality of cavities, each of the cavities containing solder, aligning a plurality of the electronic modules on the mold such that the interposer wafer portions of the modules overly the cavities, simultaneously exerting pressure on each of the electronic modules in the direction of the mold with a resilient contact pad, reflowing the solder within the cavities while pressure is exerted on the electronic modules, and causing the solder to be transferred to and form solder bumps on the interposer wafer portions of the electronic modules. The plurality of electronic modules are separated simultaneously from the mold.

A further method includes providing a top chip wafer including a plurality of interposer wafer portions attached and electrically connected to a top surface of the top chip wafer, dicing the top chip wafer between the interposer wafer portions, thereby forming a plurality of discrete electronic modules, each electronic module comprising a portion of the top chip wafer and an interposer wafer portion, providing a mold including a plurality of cavities, each of the cavities containing solder, aligning a plurality of the electronic modules on the mold such that the interposer wafer portions of the modules overlay the cavities, and simultaneously resiliently exerting pressure on each of the electronic modules in the direction of the mold. The method further includes reflowing the solder within the cavities while pressure is exerted on the electronic modules, causing the solder to be transferred to and form solder bumps on the interposer wafer portions of the electronic modules, and simultaneously separating the plurality of electronic modules from the mold.

A system is provided in accordance with a further aspect of the invention for forming solder bumps on three dimensional modules. The system includes a mold having a top surface and including a plurality of cavities, each of the cavities having an opening. An injection head is provided for injecting molten solder into the cavities. An assembly is further provided in the system and includes a fixture, a plurality of resilient contact pads attached to the fixture, and a plurality of vacuum lines extending through the fixture and the resilient contact pads, the contact pads comprising vacuum openings communicating with the vacuum lines and positioned in opposing relation to the top surface of the mold.

A system in accordance with a further aspect includes a mold having a top surface and including a plurality of cavities, each of the cavities having an opening and containing solder. An assembly is provided that includes a fixture, a plurality of resilient contact pads attached to the fixture, and a plurality of vacuum lines extending through the fixture and the resilient contact pads, the contact pads comprising vacuum openings communicating with the vacuum lines and positioned in opposing relation to the top surface of the mold.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments disclosed herein or elements thereof can be implemented in the form of a computer program product including a tangible computer readable recordable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

BRIEF DESCRIPTION OF THE DRAWINGS

FIGS. 4A-H schematically illustrate a second procedure for transferring solder to a plurality of diced modules on a three-dimensional stacked structure.

DETAILED DESCRIPTION

Figure 1A:
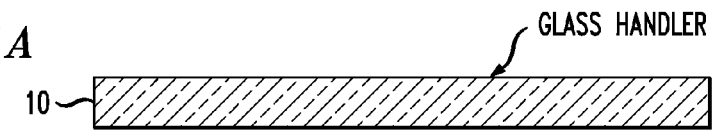
FIGS. 1A-G schematically illustrate a first method for wafer-level assembly for chip stacking.
Figure 1B:

Referring to FIGS. 1A-G, steps in performing a first method for assembling dies to an interposer wafer and subsequently forming solder bumps on the interposer wafer are shown. A glass handler 10 as shown in FIG. 1A provides a rigid support for elements that are introduced in the method. As shown in FIG. 1B, an interposer wafer 12 is attached (e.g. bonded by an adhesive) to the glass handler 10. The interposer wafer is typically a relatively thin structure comprising silicon and is used to connect multiple chips or other devices. Contact pads (not shown) on both sides of the interposer wafer 12 and through vias 14 enable such connections.

Figure 1C:
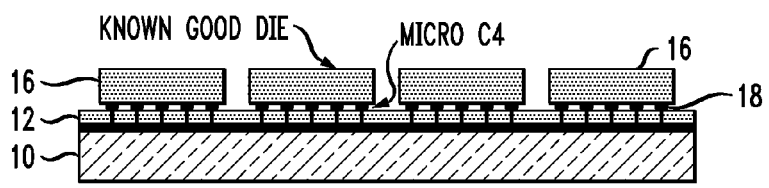
Figure 1D:
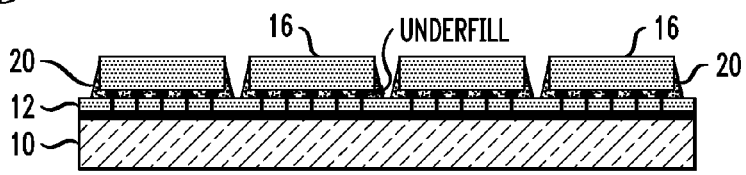
Figure 1E:

Referring to FIG. 1C, chips (dies) 16 such as IC chips are stacked on the interposer wafer. Each chip may comprise an integrated circuit. In this exemplary embodiment, microbumps (micro C4) 18 are employed to connect the chips to the interposer wafer. The areas between the chips and interposer wafer are filled with an underfill material 20 such as epoxy and cured in a process familiar to those of ordinary skill in the art, as shown in FIG. 1D. The glass handler 10 is then detached from the interposer wafer 12, resulting in the structure shown in FIG. 1E.

Figure 1F:
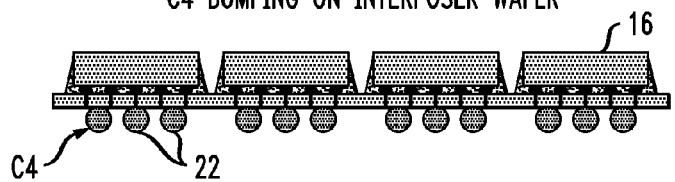
Figure 1G:
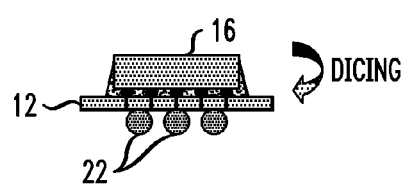

C4 bumping 22 on the interposer wafer following removal of the glass handler 10, as shown in FIG. 1F, can be difficult due to possible warpage and handling problems. Photolithography, which is required for electroplating, is also difficult when applied to a thin wafer with through vias. While C4 bumping on a diced stack is not difficult, it is impractical from a production standpoint. In the method shown in FIGS. 1A-1G, dicing of the interposer wafer 12 to form the stacked structure (module) shown in FIG. 1G occurs subsequent to C4 bumping.

Figure 2A:
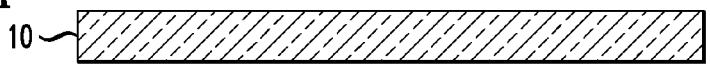
FIGS. 2A-H schematically illustrate a second method for wafer-level assembly for chip stacking.
Figure 2B:
Figure 2C:
Figure 2D:
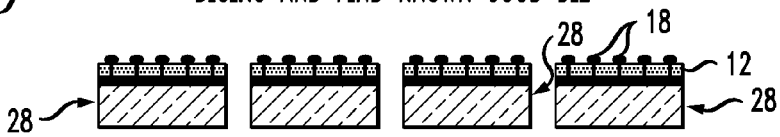
Figure 2E:
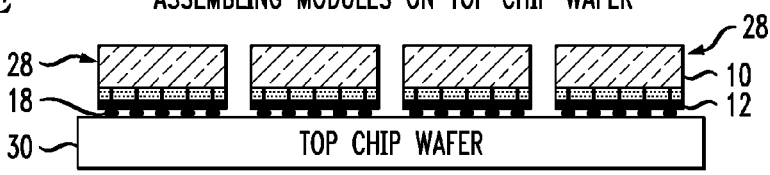
Figure 2F:
Figure 2G:
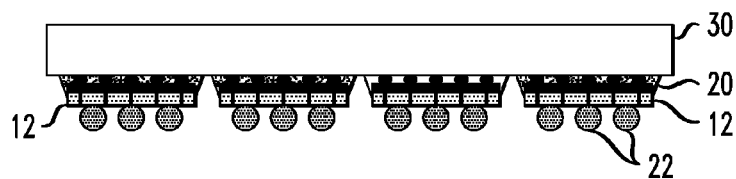
Figure 2H:
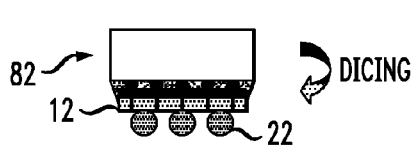

C4 bumping on the interposer wafer 12 can be conducted subsequent to the attachment of a top chip wafer 30, which may comprise, for example, a central processing unit (CPU), a memory, or integrated circuit (IC), in the method shown in FIGS. 2A-H. The attachment of the top chip wafer facilitates handling of the structure. The steps shown in FIGS. 2A and 2B are the same as the steps shown in FIGS. 1A and 1B. As shown in FIG. 2C, microbumps 18 are formed on the top surface of the interposer wafer 12. (It will be appreciated that if the structure shown in FIG. 2C is flipped, the "top" surface of the interposer wafer may be on the "bottom" of the structure.) The resulting assembly is diced, as shown in FIG. 2D, forming individual assembly modules 28. Modules 28 having good dies are selected and connected to the top chip wafer 30 by the following solder reflow as shown in FIG. 2E. The diced glass handler 10 is removed and underfill material 20 applied and cured, forming the structure shown in FIG. 2F. C4 bumping 22 on the diced interposer wafer on the top chip wafer 30 is then conducted in FIG. 2G. This step is followed by dicing of the top chip wafer 30 as shown in FIGS. 2G and 2H, forming individual electronic modules 82. Electroplating C4 bumping using this method is not feasible as it is difficult to apply a continuous seed layer between the gaps between chips in FIG. 2F and FIG. 2G. The photolithography required for electroplating is also challenging due to the topography of the structure.

Simultaneous solder transfer from a template to a plurality of diced electronic modules as disclosed herein provides effective C4 bumping on three dimensional stacked electronic structures. In particular, use of a fixture comprising resilient materials and providing a vacuum to retain the electronic modules enables C4 bumping with high throughput even though the stacked modules are diced before bumping. Injection molded solder (IMS) or preformed solder balls can be used to fill cavities of the template. A polymer coated layer on a glass or silicon template can be used to facilitate release of the solder from the cavities during the transfer process as described more fully below.

Figure 3A:
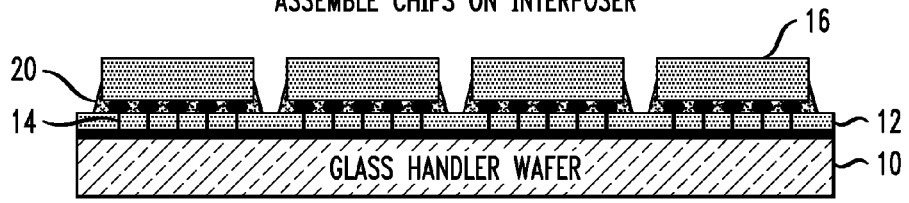
FIGS. 3A-M schematically illustrate a first procedure for transferring solder to a plurality of diced modules on a three-dimensional stacked structure.
Figure 3B:
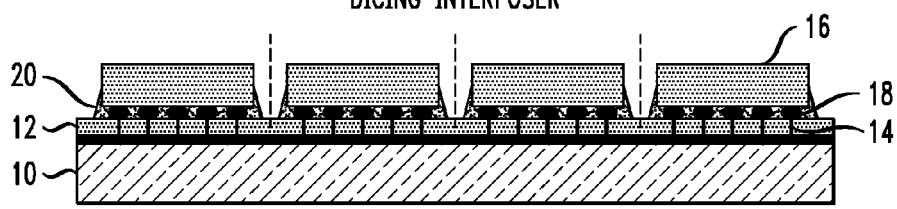
Figure 3C:
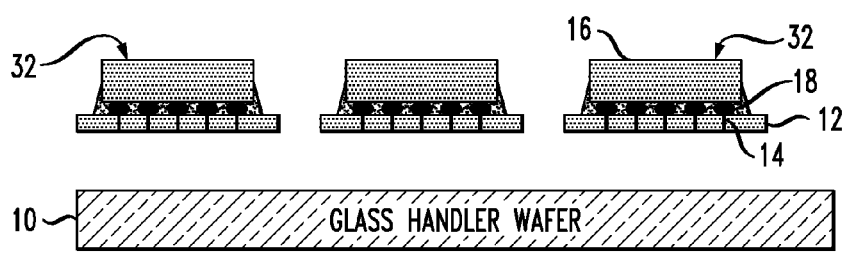
Figure 3D:
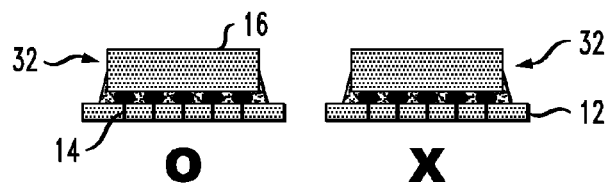

Referring to FIGS. 3A-M, a three dimensional flip chip assembly method and a system for performing such a method are shown. FIG. 3A shows a structure which is the same as that shown in FIG. 1D and which is produced by steps as shown in FIGS. 1A-C. The structure includes a glass handler wafer 10, an interposer wafer 12, a plurality of dies (e.g. integrated circuit dies) 16, microbumps 18 connecting the dies and interposer wafer, and underfill material 20 (e.g. epoxy) between the dies and wafer. As shown in FIGS. 3B and 3C, the interposer wafer 12 is diced and the resulting electronic modules 32 are detached from the glass handler wafer 10. The individual modules 32 may then be optionally electrically tested such that only modules which pass the testing procedures are employed for further processing.

Figure 3E:
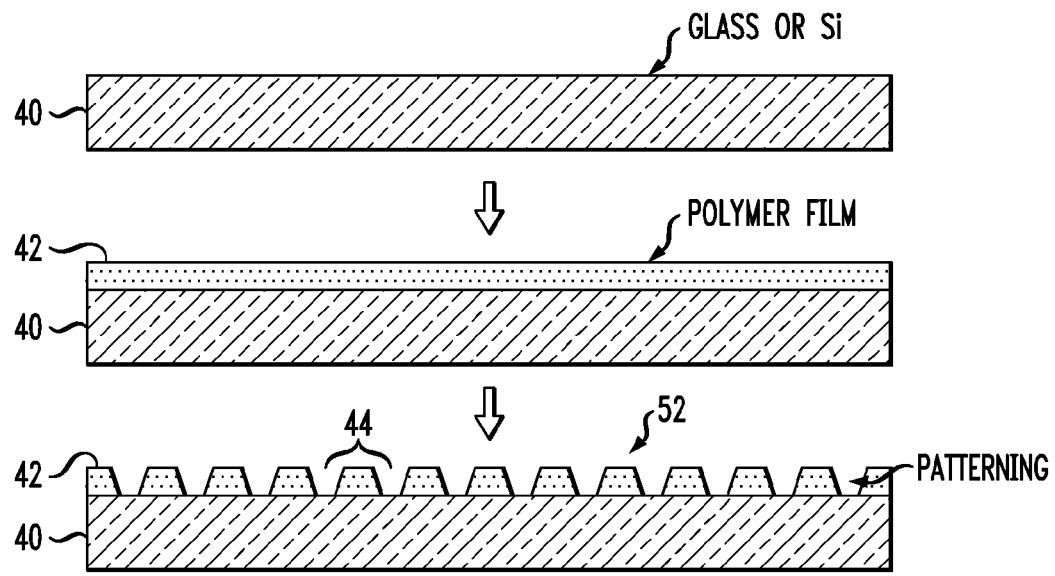
Figure 3F:
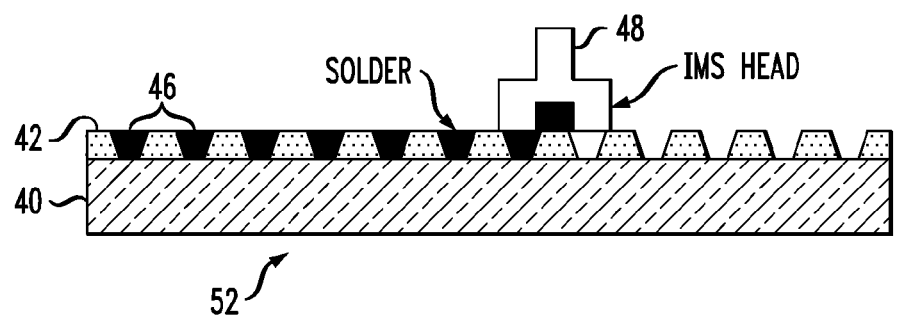
Figure 3G:
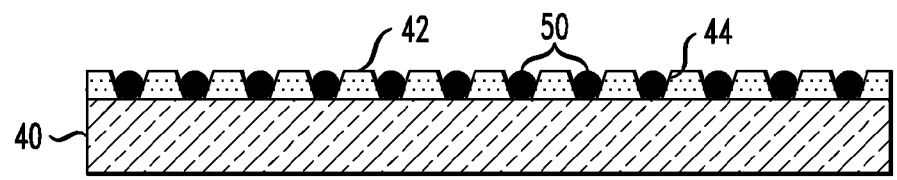

FIGS. 3E-3G illustrate the preparation of an exemplary mold that may be used in the flip chip assembly methods disclosed herein. A glass or silicon substrate 40 as shown in FIG. 3E is provided. A polymer film 42 (e.g. a dry multi-purpose photoresist, photosensitive polyimide (PSPI), Upilex, or Kapton) is applied to the substrate 40 by any suitable method, such as spin coating, film lamination or printing. The polymer film 42 should be fully cured and stable at the melting point of the solder employed in later processing. The polymer film is patterned, as shown in FIG. 3E by any suitable procedure such as laser drilling or photolithography. Such patterning forms a plurality of cavities 44. Referring to FIG. 3F, each cavity is filled with molten solder 46 by injection from an injection head 48 connected to a solder supply (not shown). Alternatively, preformed solder balls 50 can be deposited into the cavities as shown in FIG. 3G. In either case, a mold 52 is provided that includes solder-filled cavities.

Figure 3H:
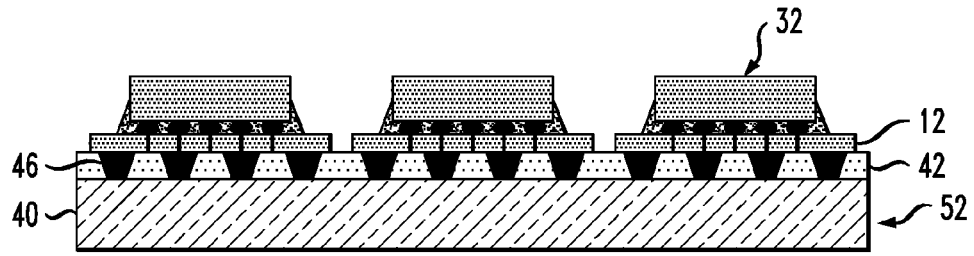
Figure 3I:
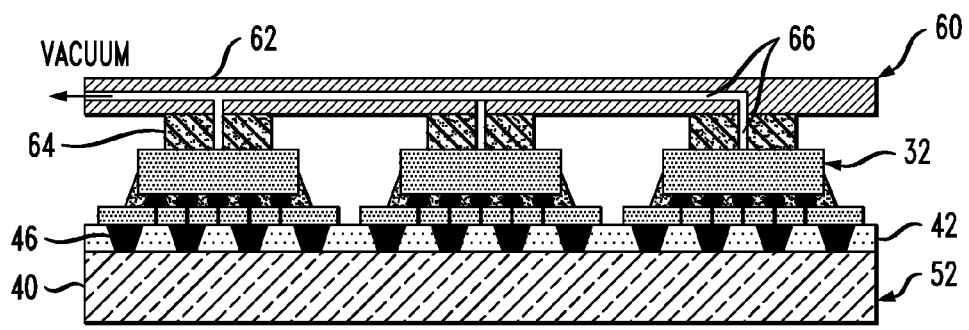
Figure 3I:
Figure 3J:
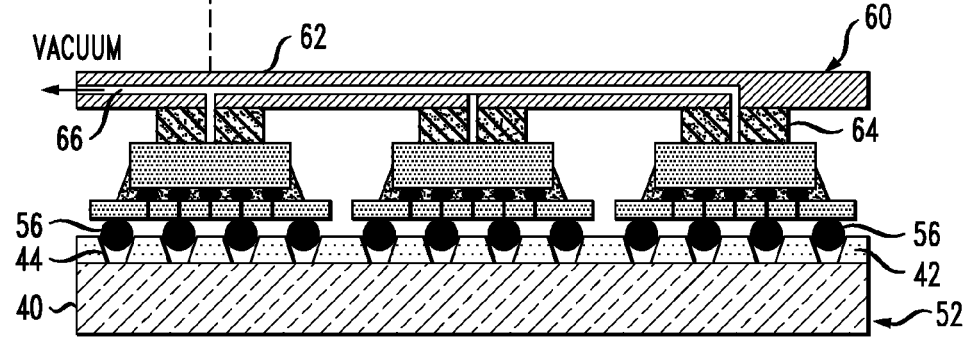
Figure 3K:
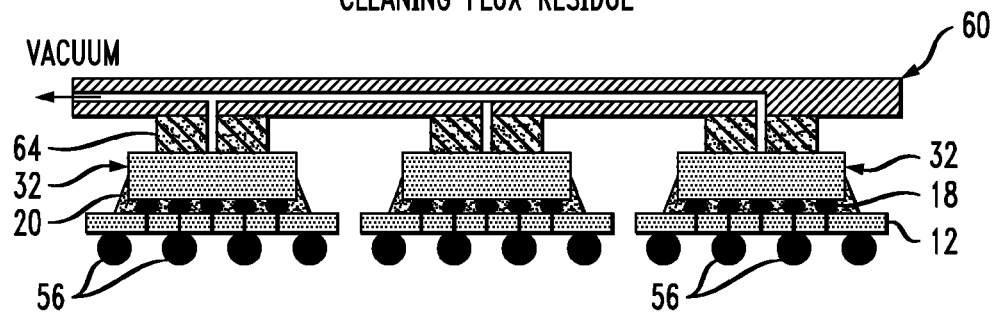
Figure 3L:
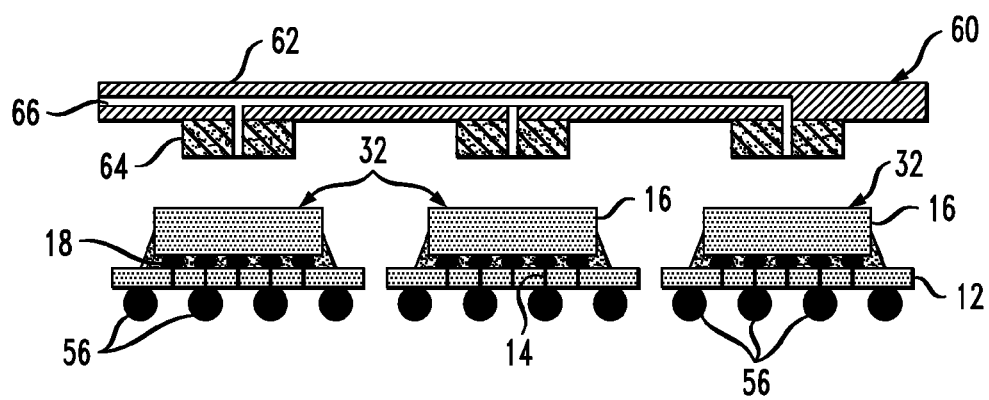
Figure 3M:
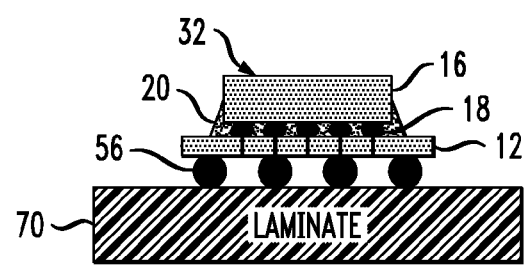

Referring now to FIG. 3H, the modules 32 that have passed testing are aligned on the solder injected mold 52. Flux can be used on top of injection molded solder. Alternatively, formic acid can be used for reflow. An assembly 60 comprising a rigid, plate-like metal or glass fixture 62, a plurality of resilient, deformable pads 64 (e.g. silicone sponge, silicone rubber, silicone foam) and vacuum lines 66 extending through the fixture and pads is employed to apply pressure to the modules 32 as shown in FIG. 3I. In this exemplary embodiment, there is one pad 64 for each module 32. A fixture positioning mechanism 68, which may be mechanical, hydraulic, or pneumatic, is provided for moving the fixture and attached contact pads 64 simultaneously towards and/or away from the mold 52 and applying sufficient pressure on the modules to effect vacuum coupling of the modules and the pads without damaging the modules. As discussed below, the pressure mechanism and other mechanisms disclosed herein may be controlled by software modules programmed by the equipment manufacturer and/or chip package fabricator. It will be appreciated that pressure may be applied by moving the mold towards the fixture rather than the fixture towards the mold as disclosed. The resilient, deformable pads 64 facilitate contact between the modules 32 and solder in the cavities 44, even where the heights of the modules above the mold are not completely uniform, by resiliently urging the modules towards the mold 52. The pads are also configured to form a good seal with the modules so that the vacuum lines can be effectively employed to attach the modules to the assembly 60. While only one vacuum opening is shown in each contact pad 64, it will be appreciated that multiple openings may be provided in opposing relation to the top surface of the mold 52 to facilitate vacuum connection with the modules. Upon solder reflow, solder bumps 56 adhere to the interposer wafers of the respective modules 32 as pressure is applied by the contact pads. The contact pads 64 are compressed during solder transfer to various degrees depending on the thicknesses of the modules 32, which may or may not be the same. Solder transfer from the mold does not require electroplating. While vacuum is applied through the vacuum lines, the assembly 60 is raised by fixture positioning mechanism 68 and the solder again solidifies. It is preferred that the solder be in liquid form when the modules 32 are removed from the mold. However, it is possible that the modules may be removed from the mold after the solder has solidified if the mold cavities 44 are sufficiently wide. The modules 32, now including solder bumps, are separated from the mold as the assembly 60 is raised due to the suction exerted thereon via the vacuum lines in the pads 64. (Alternatively, the mold 52 may be lowered while the assembly 60 remains stationary to separate the modules from the mold.) If flux has been used, flux residue is cleaned once the assembly and attached modules are separated from the mold 52 as shown in FIG. 3K. Discontinuation of the vacuum pressure causes the detachment of the modules 32 from the assembly 60 as shown in FIG. 3L. The modules 32 can be assembled on a laminate 70 shown in FIG. 3M or other structure and electrically connected thereto upon solder reflow. While only a limited number of modules are shown in the illustrated procedure, it will be appreciated that a large number of stacked modules may be processed simultaneously in such a manner to produce many stacked modules, each having solder bumps that facilitate electrical connections, even though the stacked modules are diced before C4 bumping. The method is applicable to single chip modules as well as multi-chip modules having multiple integrated circuits (ICs). High manufacturing throughput is accordingly possible.

Figure 4F:
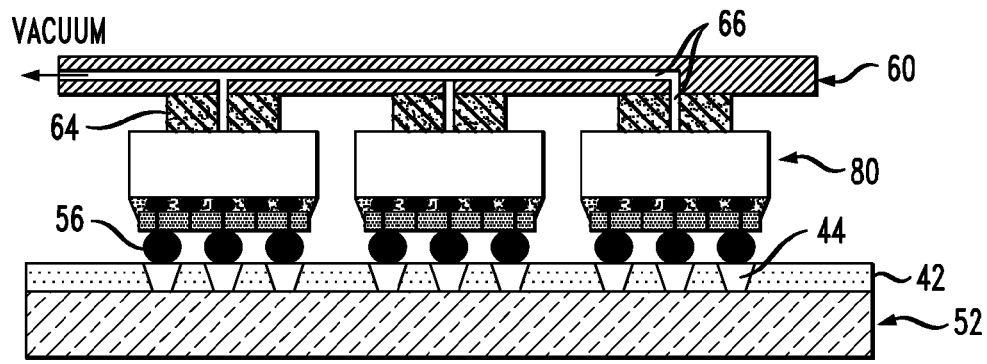
Figure 4G:
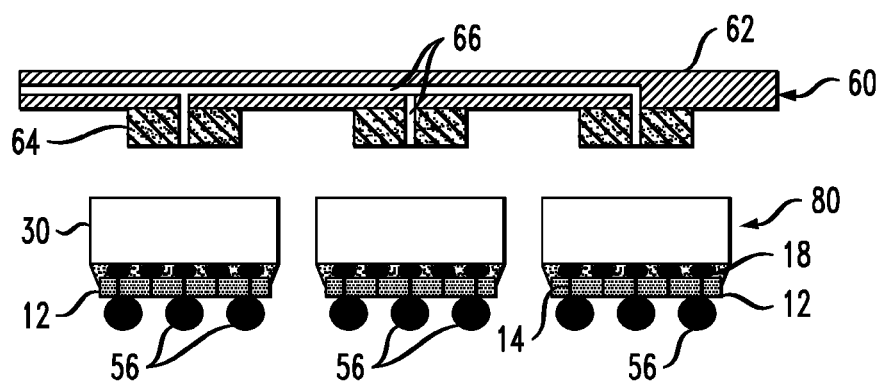

FIGS. 4A-H illustrate a further embodiment of a three dimensional flip chip assembly method and associated assembly for facilitating the method. FIG. 4A shows the same structure shown in FIG. 2F and which can also be manufactured using the steps shown in FIGS. 2A-E. Referring to FIG. 4B, the top chip wafer 30 is diced to produce individual stacked electronic modules 80, each comprising a diced portion of the top chip wafer containing, for example, a copy of an integrated circuit, a diced portion of the interposer wafer, microbumps 18 electrically connecting the top chip wafer portions and interposer wafer portions, and underfill material 20 between the top chip wafer portions and the interposer wafer portions. The modules 80 are electrically tested following dicing the top chip wafer, as shown in FIG. 4C. Modules that pass the test are selected for further processing.

Figure 4H:
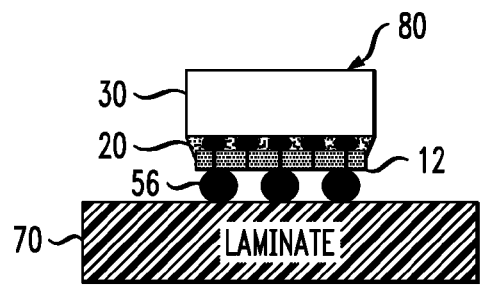

Referring to FIG. 4D, the selected modules 80 are aligned on the solder injected mold 52 as discussed above with reference to FIGS. 3E and 3F. Employing the assembly 60, also discussed above, pressure is exerted on the modules, thereby promoting good contact between the modules and the solder within the mold cavities 44 as shown in FIG. 4E during reflow. Once the solder 46 has melted, the assembly 60 and attached modules 80 are raised. The solder, having greater affinity for the interposer wafer than the mold 52, remains adhered to the interposer wafer 12 and forms the round bumps 56 depicted in FIG. 4F. If necessary, flux residue is removed from the modules 80. The modules are then detached from the top fixture by discontinuing the application of vacuum pressure to the vacuum lines in the fixture and pads. As shown in FIG. 4H, the module 80 may be mounted to a laminate 70.

Figure 5A:
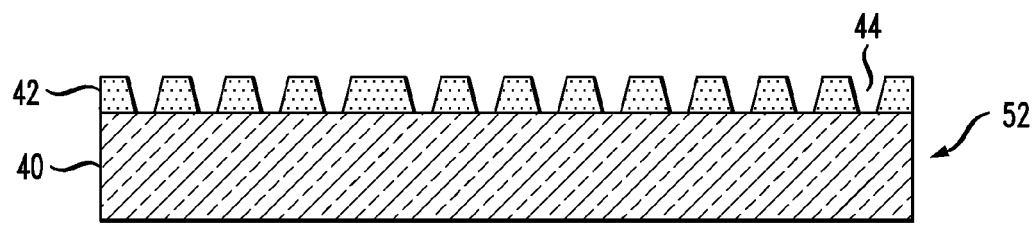
FIGS. 5A-C illustrate three options for forming molds that may be employed in the exemplary procedures shown in FIGS. 3A-N AND 4A-I.
Figure 5B:
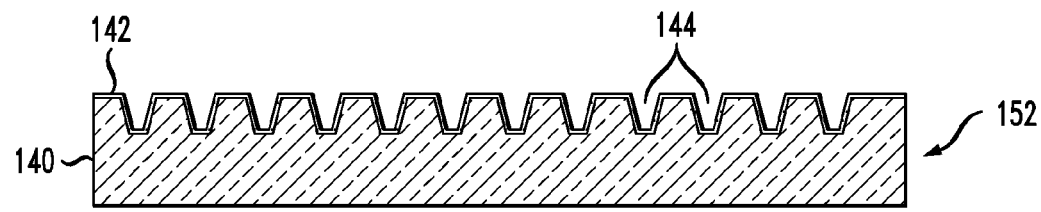
Figure 5C:
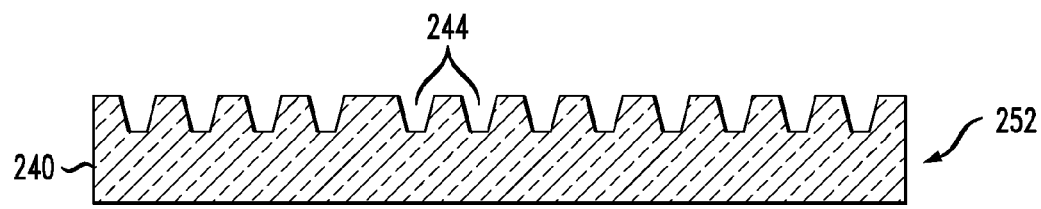

The exemplary procedures discussed above are described with respect to molds 52 comprising glass or silicon substrates and patterned polymer films 42 that define cavities 44 for receiving solder. FIG. 5A shows this type of mold. FIGS. 5B and 5C show other exemplary molds that could be used in the exemplary procedures instead of the mold 52 described above. Referring to FIG. 5B, a mold 152 may be provided by forming cavities in a glass or silicon substrate 140 and coating the substrate with a thin polymer film 142 (e.g. a dry multipurpose photoresist or silicone oxide). The cavities 144 in the mold 152 may be filled with solder from an injection head or with preformed solder balls as described with respect to FIGS. 3F and 3G, respectively. A further alternative is to form cavities 244 in the glass or silicon substrate 240 without applying a polymer film layer, as shown in the mold 252 shown in FIG. 5C.

One or more embodiments of the invention may employ almost any kind of solder. Solder may be selected from the group consisting of Sn, In, Sn—In, Sn—Pb, Sn—Au, Sn—Ag, Sn—Cu, Sn—Ag—Cu, Sn—Ag—Cu—Zn, Sn—Ag—Cu—Bi, Sn—Ag—Cu—Pd, Sn—Ag—Cu—Ti, Sn—Ag—Cu—Al, Sn—Ag—Cu—Sb, Sn—Ag—Cu—Ce, Sn—Ag—Cu—Ge, Sn—Ag—Cu—Mn, Sn—Ag—Cu—La and combinations thereof.

In one or more embodiments, the step of directly injecting the molten solder into a mold is carried out with an injection molded solder fill head, and an additional step includes causing relative motion, preferably translational motion, between (i) the head and (ii) the substrate, during the injecting.

The methods described above can be used in the packaging of integrated circuit chips, particularly flip chips. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GD-SII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips produced in accordance with the procedures described herein may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set for the herein can be used for interconnecting the chip on chips or chip stacks for 3D applications, chips on wafers, chips on package or package on package.

Given the discussion thus far, a method is provided in accordance with one exemplary embodiment that includes providing a mold including a plurality of cavities. Exemplary molds are shown in FIGS. 5A-5C. Solder is provided within the cavities as shown, for example, in FIGS. 3F, 3G and 4D. A plurality of discrete electronic modules are aligned on the mold such that the electronic modules (e.g. modules 32, 80) contact the mold and overlay the cavities as shown in FIGS. 3H and 4D. Pressure is simultaneously exerted on each of the electronic modules in the direction of the mold as shown in FIGS. 3I and 4E. The pressure is preferably exerted through the use of resilient contact pads 64 in order to better accommodate possible variations in module heights with respect to the mold. The solder is reflowed within the cavities 44 while pressure is exerted on the electronic modules. The solder is transferred to the electronic modules from the cavities and forms solder bumps 56 thereon. The electronic modules are separated from the mold such as shown in FIGS. 3J and 4F. Such separation is preferably achieved simultaneously by providing a vacuum through vacuum lines 66 in the contact pads 64 while the contact pads form a vacuum seal with respect to the electronic modules.

A further method includes providing an interposer wafer supported by a handler as shown in FIG. 1B and stacking a plurality of chips on a top surface of the interposer wafer as shown in FIG. 1C. The chips are attached to the top surface of the interposer wafer as shown in FIGS. 1D and 3A. The method further includes dicing the interposer wafer 12 between the chips such as shown in FIG. 3B. The chips are detached from the handler as shown in FIG. 3C, thereby forming a plurality of discrete electronic modules, each electronic module comprising one or more of the chips and a portion of the interposer wafer attached to the chip. A mold including a plurality of cavities, each of the cavities containing solder, is provided. The electronic modules are aligned on the mold such that the interposer wafer portions of the modules overly the cavities, as shown in FIG. 3H. Pressure is simultaneously exerted on each of the electronic modules in the direction of the mold with a resilient contact pad as shown in FIG. 3I. The solder within the cavities is reflowed while pressure is exerted on the electronic modules. The solder is transferred to and forms solder bumps 56 on the interposer wafer portions of the electronic modules. The electronic modules are separated simultaneously from the mold as illustrated by way of example in FIG. 3J.

A further method includes providing a top chip wafer including a plurality of interposer wafer portions attached and electrically connected to a top surface of the top chip wafer and dicing the top chip wafer between the interposer wafer portions, thereby forming a plurality of discrete electronic modules, each electronic module comprising a portion of the top chip wafer and an interposer wafer portion. FIGS. 4A and 4B illustrate such steps. A mold including a plurality of cavities is provided, each of the cavities containing solder. The electronic modules are aligned on the mold such that the interposer wafer portions of the modules overlay the cavities such as shown in FIG. 4D. Pressure is simultaneously exerted on each of the electronic modules in the direction of the mold such as shown in FIG. 4E. The solder is reflowed within the cavities while pressure is exerted on the electronic modules. The solder is transferred to and forms solder bumps 56 on the interposer wafer portions of the electronic modules. The electronic modules with attached solder bumps are simultaneously separated from the mold as shown in FIG. 4F.

A system for forming solder bumps on three dimensional modules is provided in accordance with a further exemplary embodiment. The system includes a mold having a top surface and including a plurality of cavities, each of the cavities having an opening. FIGS. 5A-5C show exemplary molds of this type. An injection head 48 is provided for injecting molten solder into the cavities. An assembly 60 including a fixture 62, a plurality of resilient contact pads 64 attached to the fixture, and a plurality of vacuum lines 66 extending through the fixture and the resilient contact pads is provided wherein the contact pads comprise vacuum openings communicating with the vacuum lines and positioned in opposing relation to the top surface of the mold. Such an arrangement is shown by way of example in FIGS. 3I, 3J, 4E and 4F. The mold may comprise a glass or silicon substrate, a polymer film on the substrate, the cavities being formed in the polymer film in an exemplary aspect such as shown in FIG. 5A. Another exemplary embodiment of the system includes mechanism for raising and lowering the assembly with respect to the mold. The mold used in the system may comprise a glass or silicon substrate, the cavities being formed in the substrate, such as shown in FIGS. 5B and 5C. The mold may further include a polymer film lining the cavities as shown in the exemplary embodiment of FIG. 5B. The fixture used in any embodiment of the system may comprise a rigid plate, the contact pads being attached to the rigid plate and arranged in rows and columns. FIGS. 3I and 3F show an exemplary fixture 62 having a plate-like structure to which contact pads 64 are mounted. In this exemplary embodiment, the contact pads are each arranged to engage one module.

A system provided in accordance with a further embodiment includes a mold having a top surface and including a plurality of cavities, each of the cavities having an opening and containing solder. FIGS. 5A-5C disclose exemplary molds while FIGS. 3H and 3I shown one of such molds containing solder. The system further includes an assembly 60 including a fixture 62, a plurality of resilient contact pads 64 attached to the fixture, and a plurality of vacuum lines 66 extending through the fixture and the resilient contact pads, the contact pads comprising vacuum openings communicating with the vacuum lines and positioned in opposing relation to the top surface of the mold. The system allows the three dimensional flip chip assembly methods discussed above. The system may further include a plurality of electronic modules positioned on the mold, each of the modules engaging the top surface of the mold and overlying a plurality of the cavity openings. Each of the electronic modules in a further exemplary embodiment of the system comprises an interposer wafer portion, the interposer wafer portions of the electronic modules engaging the top surface of the mold and overlying the plurality of cavity openings. The electronic modules in any embodiment of the system may further comprise an integrated circuit chip electrically connected to the interposer wafer portion. The mold employed in the further exemplary system may comprise a glass or silicon substrate, a polymer film on the substrate, the cavities being formed in the polymer film as shown in FIG. 5A. Alternatively, the mold may comprise a glass or silicon substrate wherein the cavities are formed in the substrate. The mold may further include a polymer film lining the cavities as shown in FIG. 5B. The system may further include an injection head 48 for injecting molten solder into the cavities as shown in the exemplary embodiment of FIG. 3F. The fixture employed in an embodiment of the system is comprised of a rigid plate, the contact pads being attached to the rigid plate. The resilient contact pads can be arranged in rows and columns.

Aspects of the present invention are described herein with reference to flowchart illustrations of methods and apparatus (systems) according to embodiments of the invention. It will be understood that each block of the flowchart illustrations, and combinations of blocks in the flowchart illustrations, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be noted that any of the methods described herein can include an additional step of providing a system comprising distinct software modules embodied on a computer readable storage medium; the modules can include, for example, an initialization module, a module to cycle through test points and parameters, an output module to generate an output file, a post-processing module to reduce the data and search for anomalies, and the like. The method steps, such as those described with respect to FIGS. 1A-G, FIGS. 2A-H, FIGS. 3A-M and FIGS. 4A-H, can then be carried out using the distinct software modules and/or sub-modules of the system, as described above, executing on one or more hardware processors. Further, a computer program product can include a computer-readable storage medium with code adapted to be implemented to carry out one or more method steps described herein, including the provision of the system with the distinct software modules.

It will be appreciated and should be understood that the exemplary embodiments of the invention described above can be implemented in a number of different fashions. The embodiments were chosen and described in order to best explain the principles of the invention and the practical application, and to enable others of ordinary skill in the art to understand the invention for various embodiments with various modifications as are suited to the particular use contemplated. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising:
    attaching an interposer wafer to a glass handler;
    providing first solder bumps on the interposer wafer;
    dicing the glass handler and attached interposer wafer to form a plurality of assembly modules, each assembly module comprising a portion of the glass handler and one of the interposer wafer portions;
    mounting the assembly modules to a top chip wafer such that a plurality of the interposer wafer portions are attached and electrically connected to a top surface of the top chip wafer;
    detaching the glass handler portions from the interposer wafer portions;
    dicing the top chip wafer between the interposer wafer portions, thereby forming a plurality of discrete electronic modules, each electronic module comprising a portion of the top chip wafer and an interposer wafer portion;
    providing an assembly including a plurality resilient contact pads;
    providing a mold including a plurality of cavities, each of the cavities containing solder;
    aligning a plurality of the electronic modules on the mold such that the interposer wafer portions of the modules overlay the cavities;
    simultaneously exerting pressure on each of the electronic modules in the direction of the mold, the step of simultaneously exerting pressure on each of the electronic modules in the direction of the mold including urging the resilient contact pads against the electronic modules;
    reflowing the solder within the cavities while pressure is exerted on the electronic modules;
    causing the solder to be transferred to and form second solder bumps on the interposer wafer portions of the electronic modules, and
    separating the plurality of electronic modules simultaneously from the mold, the step of separating the plurality of electronic modules from the mold further including forming vacuum seals between the resilient contact pads and the electronic modules, wherein vacuum pressure is exerted on the electronic modules through the resilient contact pads to attach the electronic modules to the assembly.

* * * * *